(12) United States Patent
Kato et al.

(10) Patent No.: US 9,113,560 B2
(45) Date of Patent: Aug. 18, 2015

(54) SIGNAL LINE AND CIRCUIT SUBSTRATE

(71) Applicant: Murata Manufacturing Co., Ltd., Nagaokakyo-shi, Kyoto-fu (JP)

(72) Inventors: Noboru Kato, Nagaokakyo (JP); Jun Sasaki, Nagaokakyo (JP); Satoshi Ishino, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 167 days.

(21) Appl. No.: 14/063,072

(22) Filed: Oct. 25, 2013

(65) Prior Publication Data

US 2014/0048312 A1    Feb. 20, 2014

Related U.S. Application Data

(63) Continuation of application No. 13/343,740, filed on Jan. 5, 2012, now Pat. No. 8,592,687, which is a continuation of application No. PCT/JP2010/060956, filed on Jun. 28, 2010.

(30) Foreign Application Priority Data

Jul. 13, 2009 (JP) ................................. 2009-164820

(51) Int. Cl.
*H05K 1/02* (2006.01)
*H01P 3/08* (2006.01)

(52) U.S. Cl.
CPC .............. *H05K 1/0298* (2013.01); *H01P 3/081* (2013.01); *H01P 3/088* (2013.01); *H05K 1/028* (2013.01); *H05K 1/0219* (2013.01); *H05K 1/0225* (2013.01); *H05K 2201/0715* (2013.01); *H05K 2201/09618* (2013.01)

(58) Field of Classification Search
CPC ..... H05K 1/0298; H05K 1/02; H05K 1/0219; H05K 1/028; H01P 3/081; H01P 3/088
USPC .......................................................... 174/251
See application file for complete search history.

(56) References Cited

U.S. PATENT DOCUMENTS 3,962,597 A * 6/1976 Clark et al. .................... 313/586
2001/0006759 A1* 7/2001 Shipley et al. ............. 430/280.1
2009/0000804 A1* 1/2009 Kobayashi et al. ........ 174/117 F

OTHER PUBLICATIONS

Kato et al., "Signal Line and Circuit Substrate", U.S. Appl. No. 13/343,740, filed Jan. 5, 2012.

* cited by examiner

*Primary Examiner* — Timothy Thompson
*Assistant Examiner* — Charles Pizzuto
(74) *Attorney, Agent, or Firm* — Keating & Bennett, LLP

(57) ABSTRACT

A signal line is a linear conductor provided within a laminated body. A first ground conductor is provided on a positive direction side in a z axis direction within the laminated body, compared with the signal line, and overlaps with the signal line in a planar view seen from the z axis direction. A second ground conductor is provided on a negative direction side in the z axis direction within the laminated body, compared with the signal line, and overlaps with the signal line in the planar view seen from the z axis direction. Via hole conductors connect the ground conductors to each other. In the first ground conductor, a plurality of opening portions are arranged along the signal line in the planar view seen from the z axis direction. The via hole conductors are provided between the opening portions adjacent to one another, in an x axis direction.

10 Claims, 5 Drawing Sheets

10a, 10b

SIGNAL LINE AND CIRCUIT SUBSTRATE

BACKGROUND OF THE INVENTION

1. Field of the Invention

The present invention relates to a signal line and the circuit substrate thereof, and, more specifically, relates to a signal line that is capable of being easily inflected and reducing unnecessary radiation, and a circuit substrate thereof.

2. Description of the Related Art

As a signal line of the related art, for example, a flexible substrate described in Japanese Unexamined Patent Application Publication No. 2007-123740 is known. FIGS. 5A and 5B are cross-section structure diagrams of a flexible substrate 500 described in Japanese Unexamined Patent Application Publication No. 2007-123740.

A cross-section structure illustrated in FIG. 5A and a cross-section structure illustrated in FIG. 5B are alternately disposed, and hence the flexible substrate 500 is configured. More specifically, the flexible substrate 500 includes insulation layers 502a to 502d, a signal line 504 and ground layers 506a and 506b. Insulation layers 502a to 502d are sheets including flexible material and laminated. The signal line 504 is provided on the insulation layer 502c, and extends parallel to the vertical direction of the plane of paper of FIG. 5A.

As illustrated in FIG. 5A, the ground layer 506a is provided on the insulation layer 502b, and located above the signal line 504 in a lamination direction. As illustrated in FIG. 5A, the ground layer 506b is provided on the insulation layer 502d, and located below the signal line 504 in the lamination direction. In this way, in the flexible substrate 500, in the cross-section structure diagram illustrated in FIG. 5A, the ground layers 506a and 506b overlap with the signal line 504 in the lamination direction. In this regard, however, in the flexible substrate 500, in the cross-section structure diagram illustrated in FIG. 5B, the ground layers 506a and 506b do not overlap with the signal line 504 in the lamination direction. Namely, opening portions 508a and 508b are provided in the ground layers 506a and 506b, respectively.

Such a flexible substrate 500 as described above is easy to inflect and use, as described below. More specifically, since the ground layers 506a and 506b are configured using metal foil or the like, it is hard for the ground layers 506a and 506b to expand and contract compared with the insulation layers 502a to 502d. Therefore, as illustrated in FIG. 5B, in the flexible substrate 500, the opening portions 508a and 508b are provided in the ground layers 506a and 506b. Accordingly, in a portion illustrated in FIG. 5B, since the widths of the ground layers 506a and 506b become small, it is easy for the ground layers 506a and 506b to expand and contract. As a result, it is possible to easily bend the flexible substrate 500.

However, the flexible substrate 500 has a problem that unnecessary radiation from the signal line 504 occurs. More specifically, the opening portions 508a and 508b are provided in the ground layers 506a and 506b. Therefore, in a planar view seen from a lamination direction, the signal line 504 is exposed through the opening portions 508a and 508b. As a result, unnecessary radiation that is fundamentally absorbed by the ground layers 506a and 506b leaks to the outside of the flexible substrate 500 through the opening portions 508a and 508b.

SUMMARY OF THE INVENTION

Therefore, preferred embodiments of the present invention provide a signal line and a circuit substrate, which are capable of being easily inflected and reducing unnecessary radiation.

A signal line according to a first preferred embodiment of the present invention includes a laminated body including a plurality of insulator layers that include flexible material and are laminated; a linear signal line provided within the laminated body; a first ground conductor located above the linear signal line in a lamination direction within the laminated body and overlapping with the linear signal line in a planar view seen from the lamination direction; a second ground conductor located below the linear signal line in the lamination direction within the laminated body and overlapping with the linear signal line in the planar view seen from the lamination direction; and a via hole conductor connecting the first ground conductor and the second ground conductor to each other, wherein in the first ground conductor, a plurality of first opening portions are arranged along the linear signal line in the planar view seen from the lamination direction, and in the planar view seen from the lamination direction, the via hole conductor is located between the first opening portions adjacent to each other, in a direction in which the linear signal line extends.

A circuit substrate according to a second preferred embodiment of the present invention includes a main body including a plurality of insulator layers that include flexible material and are laminated and including a first circuit portion, a second circuit portion, and a signal line portion; a linear signal line provided within the signal line portion; a first ground conductor located above the linear signal line in a lamination direction within the signal line portion and overlapping with the linear signal line in a planar view seen from the lamination direction; a second ground conductor located below the signal line in the lamination direction within the signal line portion and overlapping with the linear signal line in the planar view seen from the lamination direction; and a via hole conductor connecting the first ground conductor and the second ground conductor to each other, wherein in the first ground conductor, a plurality of first opening portions are arranged along the linear signal line in the planar view seen from the lamination direction, in the planar view seen from the lamination direction, the via hole conductor is provided between the first opening portions adjacent to each other, in a direction in which the linear signal line extends, and the first circuit portion and the second circuit portion include a first circuit and a second circuit, respectively, the first circuit and the second circuit being connected to the linear signal line, the first ground conductor, and the second ground conductor.

According to various preferred embodiments of the present invention, it is possible to easily inflect a signal line and a circuit substrate and it is also possible to reduce unnecessary radiation.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Hereinafter, a signal line and a circuit substrate according to preferred embodiments of the present invention will be described with reference to drawings.

First Preferred Embodiment

Figure 1:
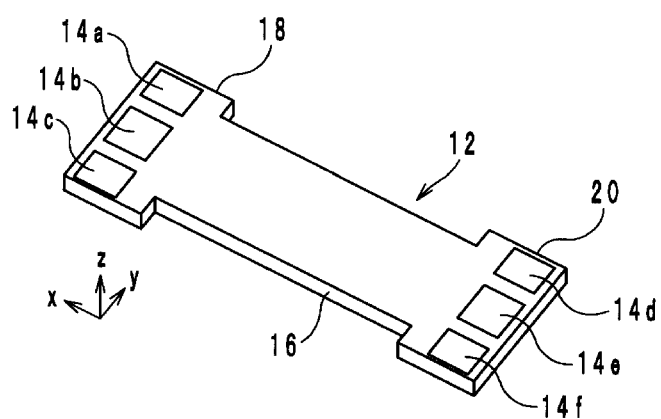
FIG. 1 is an external appearance perspective view of a signal line according to a preferred embodiment of the present invention.
Figure 2A:
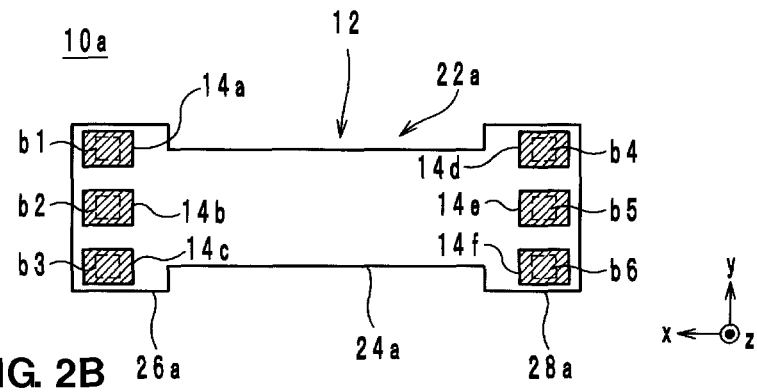
FIGS. 2A-2D are exploded views of the signal line in FIG. 1.
Figure 2B:
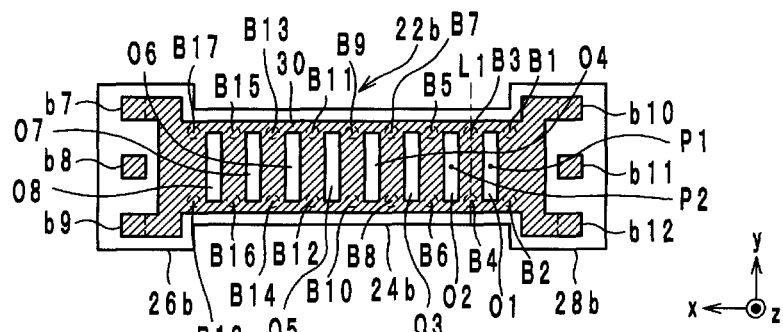
Figure 2C:
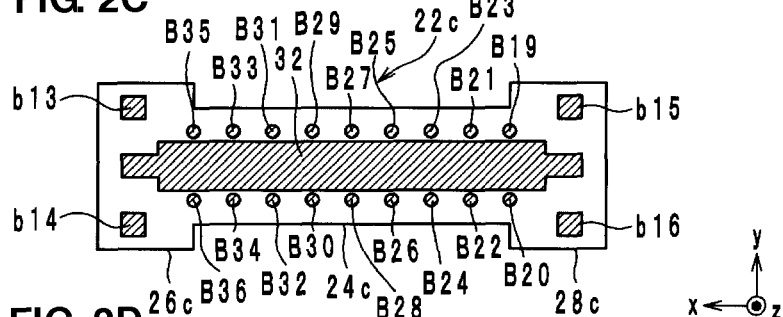
Figure 2D:
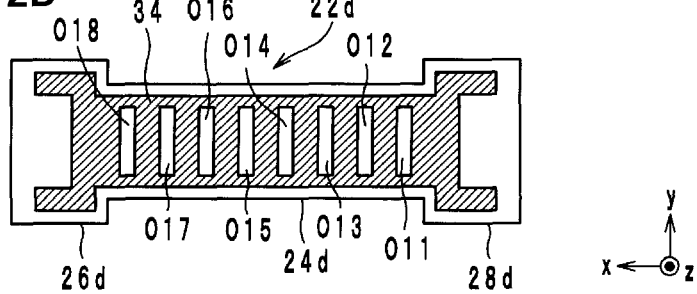
Figure 3A:
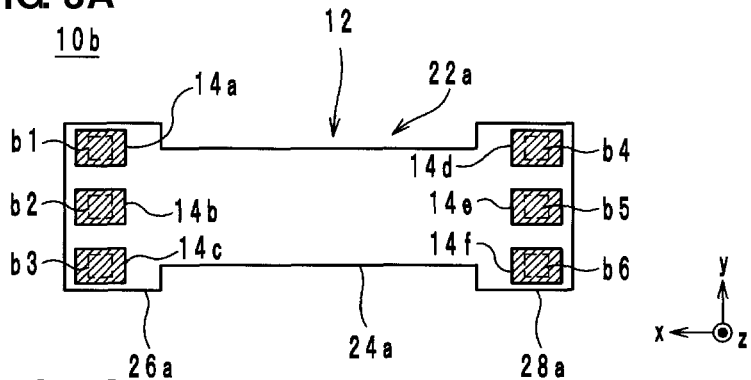
FIGS. 3A-3D are exploded views of a signal line according to an example of a modification of a preferred embodiment of the present invention.
Figure 3B:
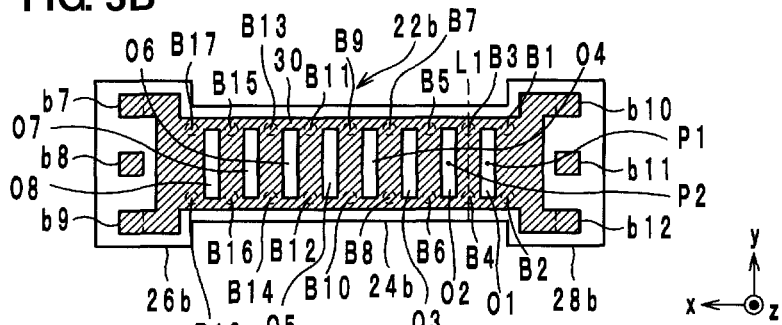
Figure 3C:
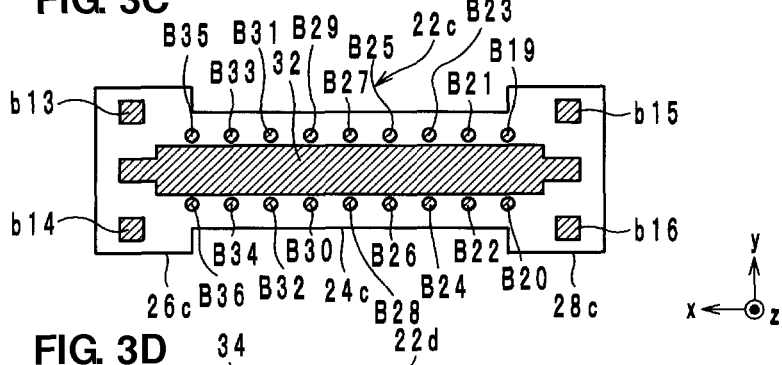
Figure 3D:
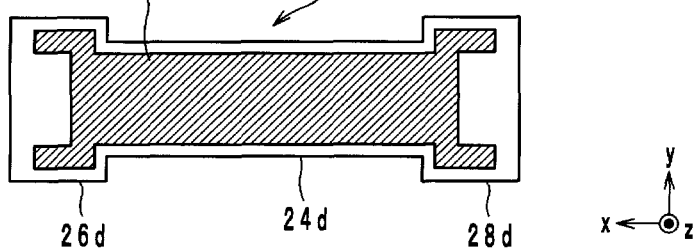

Hereinafter, the configuration of a signal line according to a first preferred embodiment of the present invention will be described with reference to drawings. FIG. 1 is an external appearance perspective view of a signal line 10a, 10b according to a preferred embodiment of the present invention. FIGS. 2A-2D are exploded views of the signal line 10a in FIG. 1. In FIG. 1 and FIGS. 2A-2D, the lamination direction of the signal line 10a is defined as a z axis direction. In addition, the longitudinal direction of the signal line 10a is defined as an x axis direction, and a direction perpendicular to the x axis direction and the z axis direction is defined as a y axis direction, for example.

For example, the signal line 10a connects two circuit substrates to each other in an electronic device such as a mobile phone or the like. As illustrated in FIG. 1 and FIGS. 2A-2D, the signal line 10a includes a laminated body 12, external terminals 14 (14a to 14f), ground conductors 30 and 34, a linear signal line 32, and via hole conductors b1 to b16 and B1 to B36.

As illustrated in FIG. 1, the laminated body 12 includes a signal line portion 16 and connector portions 18 and 20. The signal line portion 16 extends in the x axis direction, and includes the linear signal line 32 and the ground conductors 30 and 34. The signal line portion 16 preferably is configured so as to be able to be bent into a U shape. The connector portions 18 and 20 are provided at both ends of the signal line portion 16 in the x axis direction, and connected to the connectors of the circuit substrates not illustrated. Insulation sheets (insulator layers) 22 (22a to 22d) illustrated in FIGS. 2A-2D are laminated from the positive direction side of the z axis direction to the negative direction side thereof in this order, thereby configuring the laminated body 12.

The insulation sheet 22 is preferably made of thermoplastic resin such as liquid crystalline polymer having flexibility, or the like. As illustrated in FIGS. 2A-2D, the insulation sheets 22a to 22d preferably include signal line portions 24a to 24d, connector portions 26a to 26d, and connector portions 28a to 28d, respectively. The signal line portion 24 configures the signal line portion 16 of the laminated body 12, and the connector portions 26 and 28 configure the connector portions 18 and 20 of the laminated body 12, respectively. In addition, hereinafter, a main surface on a positive direction side in the z axis direction of the insulation sheet 22 is referred to as a front surface, and a main surface on a negative direction side in the z axis direction of the insulation sheet 22 is referred to as a back surface.

As illustrated in FIGS. 2A-2D, the external terminals 14a to 14c are arranged so as to define a line in the y axis direction on the front surface of the connector portion 26a. When the connector portion 18 is inserted into the connector of the circuit substrate, the external terminals 14a to 14c are in contact with terminals within the connector. Specifically, the external terminals 14a and 14c are in contact with ground terminals within the connector, and the external terminal 14b is in contact with a signal terminal within the connector. Accordingly, a ground potential is applied to the external terminals 14a and 14c, and a high-frequency signal (for example, about 2 GHz) is applied to the external terminal 14b.

As illustrated in FIGS. 2A-2D, the external terminals 14d to 14f are arranged so as to define a line in the y axis direction on the front surface of the connector portion 28a. When the connector portion 20 is inserted into the connector of the circuit substrate, the external terminals 14d to 14f are in contact with terminals within the connector. Specifically, the external terminals 14d and 14f are in contact with ground terminals within the connector, and the external terminal 14e is in contact with a signal terminal within the connector. Accordingly, a ground potential is applied to the external terminals 14d and 14f, and a high-frequency signal (for example, about 2 GHz) is applied to the external terminal 14e.

As illustrated in FIGS. 2A-2D, the linear signal line preferably is a linear conductor provided within the laminated body 12, and preferably is provided on the front surface of the insulation sheet 22c. The linear signal line 32 extends in the x axis direction on the front surface of the insulation sheet 24c. In addition, both ends of the linear signal line 32 are located at the connector portions 26c and 28c, respectively.

As illustrated in FIGS. 2A-2D, the ground conductor 30 is provided on a positive direction side in the z axis direction within the laminated body 12, compared with the linear signal line 32, and more specifically, is provided on the front surface of the insulation sheet 22b. The ground conductor 30 extends in the x axis direction on the front surface of the signal line portion 24b. One end of the ground conductor 30 is arranged such that the end thereof branches into two portions in the connector portion 26b, and the other end of the ground conductor 30 is arranged such that the end thereof branches into two portions in the connector portion 28b. Furthermore, as illustrated in FIGS. 2A-2D, the ground conductor 30 overlaps with the signal line 32 in a planar view seen from the z axis direction.

In addition, as illustrated in FIGS. 2A-2D, in the ground conductor 30, a plurality of slit-shaped opening portions O1 to O8 in which no conductor is provided are arranged along the linear signal line 32 in the planar view seen from the z axis direction. In the present preferred embodiment, the opening portions O1 to O8 overlap with the linear signal line 32 in the planar view seen from the z axis direction. Furthermore, the opening portions O1 to O8 preferably have rectangular or substantially rectangular shapes whose longitudinal directions correspond to the y axis direction, and define a line in the x axis direction at regular intervals, for example. In addition, the openings O1 to O8 are arranged so as not to divide the ground conductor 30. More specifically, the conductor of the ground conductor 30 exists on the positive direction side and the negative direction side of the openings O1 to O8 in the y axis direction. Accordingly, the ground conductor 30 preferably has a ladder shape. As described above, the openings O1 to O8 are provided in the ground conductor 30, and hence, as illustrated in FIGS. 2A-2D, in the ground conductor 30, a relatively thick portion and a relatively thin portion are provided in width in the y axis direction.

As illustrated in FIGS. 2A-2D, the ground conductor 34 is provided on a negative direction side in the z axis direction within the laminated body 12, compared with the linear signal line 32, and more specifically, is provided on the front surface of the insulation sheet 22d. The ground conductor 34 extends in the x axis direction on the front surface of the signal line portion 24d. One end of the ground conductor 34 is arranged such that the end thereof branches into two portions in the connector portion 26d, and the other end of the ground conductor 34 is arranged such that the end thereof branches into two portions in the connector portion 28d. Furthermore, as illustrated in FIGS. 2A-2D, the ground conductor 34 overlaps with the linear signal line 32 in the planar view seen from the z axis direction.

In addition, in the ground conductor 34, a plurality of slit-shaped opening portions O11 to O18 in which no conductor is provided are arranged along the linear signal line 32 in the planar view seen from the z axis direction. In the present preferred embodiment, the opening portions O11 to O18 overlap with the linear signal line 32 in the planar view seen from the z axis direction. In addition, in the planar view seen from the z axis direction, the opening portions O11 to O18 overlap with the opening portions O1 to O8, respectively, in a state in which the opening portions O11 to O18 coincide with the opening portions O1 to O8, respectively. More specifically, in the same way as the opening portions O1 to O8, the opening portions O11 to O18 preferably have rectangular or substantially rectangular shapes whose longitudinal directions correspond to the y axis direction, and define a line in the x axis direction at regular intervals. In addition, in the same way as the opening portions O1 to O8, the opening portions O11 to O18 are arranged so as not to divide the ground conductor 34. More specifically, the conductor of the ground conductor 34 exists on the positive direction side and the negative direction side of the openings O11 to O18 in the y axis direction. Accordingly, the ground conductor 34 preferably has a ladder shape. As described above, the openings O11 to O18 are provided in the ground conductor 34, and hence, as illustrated in FIGS. 2A-2D, in the ground conductor 34, a relatively thick portion and a relatively thin portion are provided in the width thereof extending in the y axis direction.

As illustrated in FIGS. 2A-2D, the via hole conductors b1 and b3 are provided so as to penetrate through the connector portion 26a in the z axis direction, and connect the external terminals 14a and 14c to the ground conductor 30, respectively. As illustrated in FIGS. 2A-2D, the via hole conductor b2 is provided so as to penetrate through the connector portion 26a in the z axis direction, and is connected to the external terminal 14b.

As illustrated in FIGS. 2A-2D, each of the via hole conductors b7 and b9 is provided so as to penetrate through the connector portion 26b in the z axis direction, and is connected to the ground conductor 30. As illustrated in FIGS. 2A-2D, the via hole conductor b8 is provided so as to penetrate through the connector portion 26b in the z axis direction, and connects the via hole conductor b2 and the linear signal line 32 to each other.

As illustrated in FIGS. 2A-2D, the via hole conductors b13 and b14 are provided so as to penetrate through the connector portion 26c in the z axis direction, and connect the via hole conductors b7 and b9 to the ground conductor 34, respectively. Accordingly, the external terminal 14a is connected to the ground conductors 30 and 34 through the via hole conductors b1, b7, and b13, and the external terminal 14c is connected to the ground conductors 30 and 34 through the via hole conductors b3, b9, and b14. In addition, the external terminal 14b and the linear signal line 32 are connected to each other through the via hole conductors b2 and b8.

As illustrated in FIGS. 2A-2D, the via hole conductors b4 and b6 are provided so as to penetrate through the connector portion 28a in the z axis direction, and connect the external terminals 14d and 14f to the ground conductor 30, respectively. As illustrated in FIGS. 2A-2D, the via hole conductor b5 is provided so as to penetrate through the connector portion 28a in the z axis direction, and is connected to the external terminal 14e.

As illustrated in FIGS. 2A-2D, each of the via hole conductors b10 and b12 is provided so as to penetrate through the connector portion 28b in the z axis direction, and is connected to the ground conductor 30. As illustrated in FIGS. 2A-2D, the via hole conductor b11 is provided so as to penetrate through the connector portion 28b in the z axis direction, and connects the via hole conductor b5 and the linear signal line 32 to each other.

As illustrated in FIGS. 2A-2D, the via hole conductors b15 and b16 are provided so as to penetrate through the connector portion 28c in the z axis direction, and connect the via hole conductors b10 and b12 to the ground conductor 34, respectively. Accordingly, the external terminal 14d is connected to the ground conductors 30 and 34 through the via hole conductors b4, b10, and b15, and the external terminal 14f is connected to the ground conductors 30 and 34 through the via hole conductors b6, b12, and b16. In addition, the external terminal 14e and the linear signal line 32 are connected to each other through the via hole conductors b5 and b11.

As illustrated in FIGS. 2A-2D, the via hole conductors B1 to B18 and the via hole conductors B19 to B36 are provided so as to penetrate through the signal line portions 24b and 24c in the z axis direction, respectively, and connect the ground conductor 30 and the ground conductor 34 to each other. Furthermore, in the planar view seen from the z axis direction, the via hole conductors B1 to B18 are provided between the opening portions O1 to O8 adjacent to one another, in a direction (specifically, the x axis direction) in which the signal line 32 extends. In additions, the via hole conductors B1, B3, B5, B7, B9, B11, B13, B15, and B17 are arranged so as to lie on a straight line in the x axis direction with being equally spaced. In addition, on a negative direction side in the y axis direction, compared with the via hole conductors B1, B3, B5, B7, B9, B11, B13, B15, and B17, the via hole conductors B2, B4, B6, B8, B10, B12, B14, B16, and B18 are arranged so as to lie on a straight line in the x axis direction with being equally spaced.

Furthermore, in the present preferred embodiment, the via hole conductors B3 to B16 are provided on perpendicular bisectors with respect to the centers of the opening portions O1 to O8 adjacent to one another. Hereinafter, the via hole conductors B3 and B4 will be described as an example. As illustrated in FIGS. 2A-2D, the via hole conductors B3 and B4 are provided between the opening portion O1 and the opening portion O2. Hereinafter, the points of intersection between the diagonal lines of the opening portions O1 and O2 are referred to as the centers P1 and P2 of the opening portions O1 and O2. In addition, the perpendicular bisector of the centers P1 and P2 is referred to as a straight line L1. The via hole conductor B3 is located on the straight line L1, and is provided so as to overlap with end portions on the positive direction sides of the openings O1 to O8 in the y axis direction in the planar view seen from the x axis direction. In addition, the via hole conductor B4 is located on the straight line L1, and is arranged so as to overlap with end portions on the negative direction sides of the openings O1 to O8 in the y axis direction in the planar view seen from the x axis direction.

The via hole conductors B19 to B36 are arranged in the signal line portion 24c so as to overlap with the via hole conductors B1 to B18, respectively, in the planar view seen from the z axis direction. Accordingly, the via hole conductors B19 to B36 are connected to the via hole conductors B1 to B18, respectively.

The insulation sheets 22a to 22d having the above-mentioned configurations are laminated, and hence the ground conductors 30 and 34 and the linear signal line 32 define a stripline structure. More specifically, as illustrated in FIGS.

2A-2D, the linear signal line 32 is sandwiched in between the ground conductor 30 and the ground conductor 34 in the z axis direction, and is housed within a region in which the ground conductors 30 and 34 are provided, in the planar view seen from the z axis direction. Furthermore, the ground conductor 30 and the ground conductor 34 are connected to each other through the via hole conductors B1 to B36.

The signal line 10a having the above-mentioned configuration is used in a state in which the signal line 10a is inflected. Namely, in the planar view seen from the y axis direction, the signal line 10a is inflected so as to form a U shape protruding toward one of a positive direction side and a negative direction side in the z axis direction.

Hereinafter, a manufacturing method for the signal line 10a will be described with reference to FIGS. 2A-2D. While, hereinafter, a case in which one signal line 10a is manufactured will be described as an example, actually, large-sized insulation sheets are laminated and cut, thereby simultaneously manufacturing a plurality of the signal lines 10a.

First, the insulation sheet 22 is prepared where copper foil is formed on the entire surface of the front surface. For example, the front surface of the copper foil of the insulation sheet 22 is plated with zinc for antirust effect, thereby being smoothed.

Next, the external terminal 14 illustrated in FIGS. 2A-2D is formed on the front surface of the insulation sheet 22a through a photolithography process. Specifically, on the copper foil of the insulation sheet 22a, resist having the same shape as the external terminal 14 illustrated in FIGS. 2A-2D is printed. In addition, the copper foil is subjected to etching processing, thereby removing the copper foil of a portion not covered with the resist. After that, the resist is removed. Accordingly, such an external terminal 14 as illustrated in FIGS. 2A-2D is formed on the front surface of the insulation sheet 22a.

Next, the ground conductor 30 illustrated in FIGS. 2A-2D is formed on the front surface of the insulation sheet 22b through a photolithography process. In addition, the linear signal line 32 illustrated in FIGS. 2A-2D is formed on the front surface of the insulation sheet 22c through a photolithography process. In addition, the ground conductor 34 illustrated in FIGS. 2A-2D is formed on the front surface of the insulation sheet 22d through a photolithography process. In addition, since these photolithography processes are the same as the photolithography process performed when the external terminal 14 is formed, the descriptions thereof will be omitted. Owing to the above-mentioned processes, the ground conductors 30 and 34 adhere to the front surfaces of the insulation sheets 22b and 22d, and the linear signal line 32 adheres to the front surface of the insulation sheet 22c.

Next, positions at which the via hole conductors b1 to b16 and B1 to B36 of the insulation sheets 22a to 22c are to be formed are irradiated with a laser beam from a back surface side, thereby forming via holes. After that, via holes formed in the insulation sheets 22a to 22c are filled with conductive paste whose main component is copper, there by forming the via hole conductors b1 to b16 and B1 to B36 illustrated in FIGS. 2A-2D.

Next, the insulation sheets 22a to 22d are stacked from a positive direction side in the z axis direction to a negative direction side therein in this order so that the ground conductor 30, the linear signal line 32, and the ground conductor 34 define a stripline structure. In addition, by applying pressure on the insulation sheets 22a to 22d from the positive direction side in the z axis direction and the negative direction side therein, the insulation sheets 22a to 22d are fixed. Accordingly, the signal line 10a illustrated in FIG. 1 is obtained.

According to such a signal line 10a as described above, it is possible to easily bend the signal line 10a into a U shape, as described below. Since the ground conductors 30 and 34 are configured using metal foil or the like, it is hard for the ground conductors 30 and 34 to expand and contract compared with the insulation layers 22a to 22d. Therefore, in the signal line 10a, as illustrated in FIGS. 2A-2D, the opening portions O1 to O8 and O11 to O18 are provided in the ground conductors 30 and 34. Accordingly, the strengths of the ground conductors 30 and 34 in portions in which the opening portions O1 to O8 and O11 to O18 are provided become lower than the strengths of the ground conductors 30 and 34 in other portions. Specifically, the ground conductors 30 and 34 easily expand and contract in the x axis direction in portions on a positive direction side in the y axis direction and a negative direction side therein in portions in which the opening portions O1 to O8 and O11 to O18 are provided compared with other portions. As a result, it becomes possible to easily bend the signal line 10a. In addition, since the opening portions O1 to O8 and O11 to O18 are provided in both of the ground conductors 30 and 34 in the signal line 10a, the signal line 10a may be inflected so as to form a U shape protruding toward a positive direction side in the z axis direction in the planar view seen from the y axis direction, and furthermore, may also be inflected so as to form a U shape protruding toward a negative direction side in the z axis direction.

Furthermore, according to the signal line 10a, it is possible to reduce unnecessary radiation as described below. As illustrated in FIGS. 2A-2D, in the signal line 10a, the signal line 32 is exposed through the openings O1 to O8 and O11 to O18, in the planar view seen from the z axis direction. Therefore, it may be possible that unnecessary radiation from the signal line leaks to the outside of the signal line 10a through the openings O1 to O8 and O11 to O18.

However, in the signal line 10a, the ground conductors 30 and 34 are connected using the via hole conductors B1 to B36. Accordingly, a ground potential becomes more securely and reliably applied to the ground conductors 30 and 34. Therefore, even if the openings O1 to O8 and O11 to O18 exist, the unnecessary radiation from the signal line 32 is readily absorbed by the ground conductors 30 and 34. As a result, the unnecessary radiation from the linear signal line 32, which leaks to the outside of the signal line 10a, is reduced.

In addition, since the via hole conductors B1 to B36 is configured using metal, it is difficult for the via hole conductors B1 to B36 to be deformed compared with the insulation sheets 22a to 22d. Therefore, there is a possibility that the via hole conductors B1 to B36 prevent the signal line 10a from being easily inflected. However, for the reason described below, even if the via hole conductors B1 to B36 are provided, it is possible for the signal line 10a to become easily inflected.

More specifically, for example, when the signal line 10a is inflected so as to have a U shape protruding toward a positive direction side in the z axis direction, the ground conductor 30 relatively largely stretches in the x axis direction in portions on positive direction sides and negative direction sides in the y axis direction of the portions in which the opening portions O1 to O8 are provided. On the other hand, the ground conductor 30 only relatively slightly stretches in portions sandwiched in between the opening portions O1 to O8. Therefore, the via hole conductors B1 to B36 are provided between the opening portions O1 to O8 adjacent to one another in the x axis direction. More specifically, the via hole conductors B1 to B36 are provided in portions sandwiched in between the opening portions O1 to O8. Accordingly, the via hole conductors B1 to B36 do not prevent the portions on the positive direction sides and the negative direction sides in the y axis direction of the portions in which the opening portions O1 to O8 are provided from largely stretching. As a result, it is possible for the signal line 10a to become easily inflected. In addition, since the physical phenomenon of a case in which the signal line 10a is inflected so as to have a U shape protruding toward a negative direction side in the z axis direction is basically the same as the physical phenomenon of a case in which the signal line 10a is inflected so as to form a U shape protruding toward a positive direction side in the z axis direction, the description thereof will be omitted.

Furthermore, as illustrated in FIGS. 2A-2D, the via hole conductors B3 to B16 are provided on the perpendicular bisectors with respect to the centers of the opening portions O1 to O8 adjacent to one another. Accordingly, for the reason described below, it is possible to easily inflect the signal line 10a. More specifically, the portions on the positive direction sides and the negative direction sides in the y axis direction of the portions in which the opening portions O1 to O8 are provided are portions most largely stretching when the signal line 10a is inflected. On the other hand, in the portions sandwiched in between the opening portions O1 to O8, the perpendicular bisectors with respect to the centers of the opening portions O1 to O8 adjacent to one another are located, in the x axis direction, furthest away from the portions on the positive direction sides and the negative direction sides in the y axis direction of the portions in which the opening portions O1 to O8 are provided. Therefore, the via hole conductors B3 to B16 are disposed so as to be located away from the portions on the positive direction sides and the negative direction sides in the y axis direction of the portions in which the opening portions O1 to O8 are provided, and hence it is possible to prevent the via hole conductors B3 to B16 from inhibiting the signal line 10a from becoming inflected.

Hereinafter, a signal line according to an example of a modification of a preferred embodiment of the present invention will be described with reference to drawings. FIGS. 3A-3D are exploded views of a signal line 10b according to an example of a modification according to a preferred embodiment of the present invention. In addition, FIG. 1 provides an external appearance perspective view of the signal line 10b.

The signal line 10b differs from the signal line 10a in that the opening portions O11 to O18 are not provided in the ground conductor 34. Since the other configuration of the signal line 10b is preferably the same as the signal line 10a, the description thereof will be omitted.

The signal line 10b is inflected so that the ground conductor 30 is located on an outer periphery side, compared with the ground conductor 34. More specifically, when being viewed from the y axis direction, the signal line 10b is inflected so as to have a U shape protruding toward a positive direction side in the z axis direction. This is because the ground conductor 30 easily stretches compared with the ground conductor 34.

In addition, in the signal lines 10a and 10b, the via hole conductors B9, B10, B27, and B28 that are located near the center of the signal line portion 16 in the x axis direction may be omitted. In this case, it is possible to more easily inflect the portion in the neighborhood of the center of the signal line portion 16 in the x axis direction. In addition, the via hole conductors B1, B2, B17, B18, B19, B20, B35, and B36 that are located near both ends of the signal line portion 16 in the x axis direction may be omitted. In this case, it is possible to more easily inflect the portions in the neighborhoods of both ends of the signal line portion 16 in the x axis direction.

Figure 4:
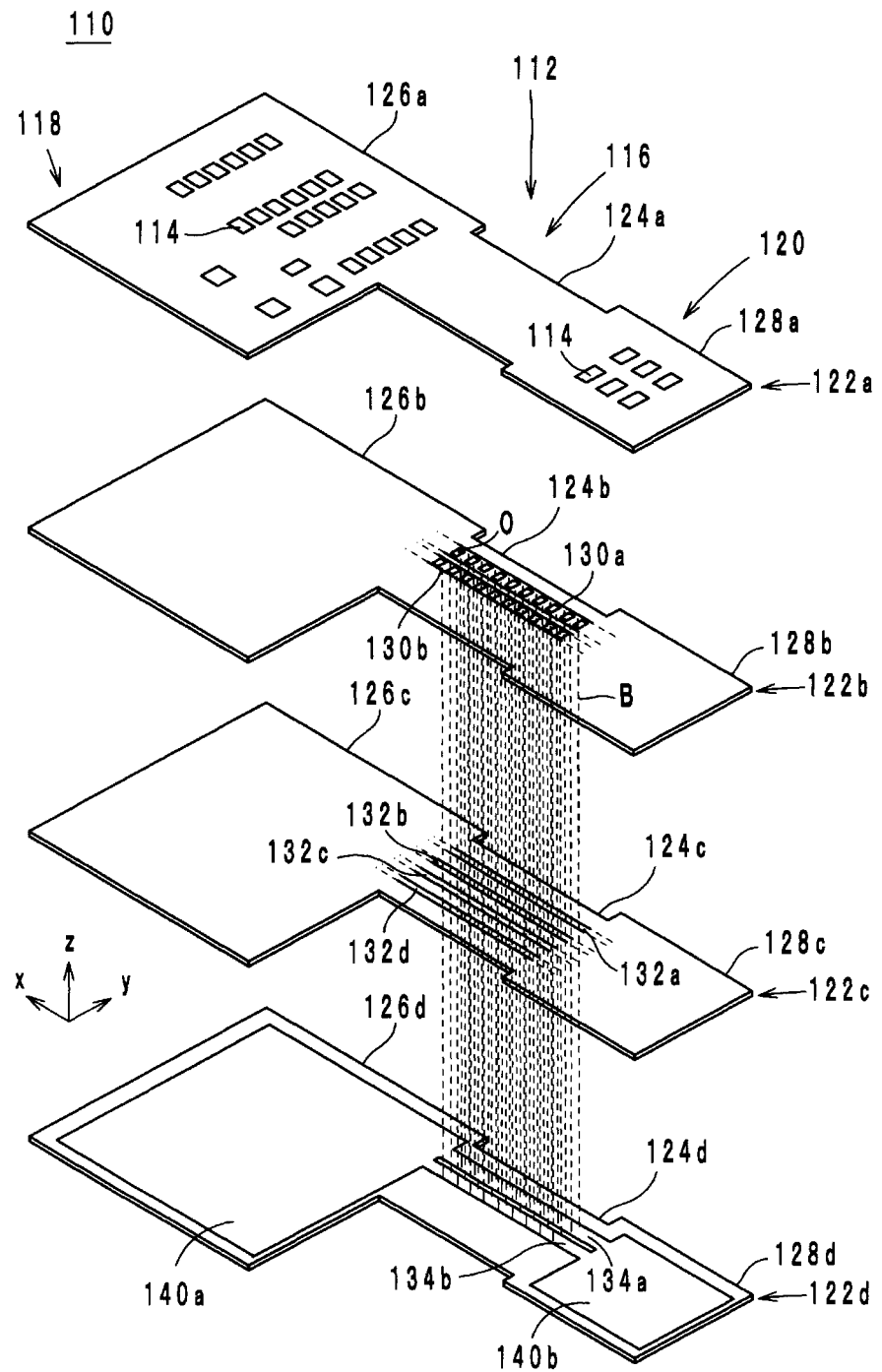
FIG. 4 is an exploded perspective view of a circuit substrate according to a second preferred embodiment of the present invention.
Figure 5A:
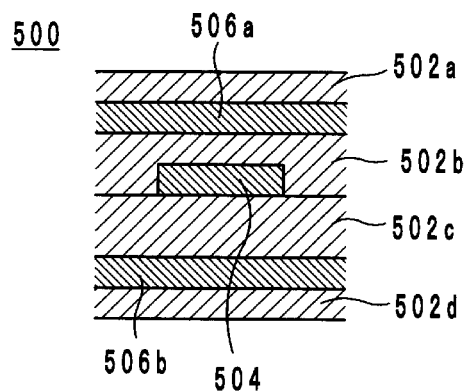
FIGS. 5A and 5B are cross-section structure diagrams of a flexible substrate described in Japanese Unexamined Patent Application Publication No. 2007-123740.
Figure 5B:
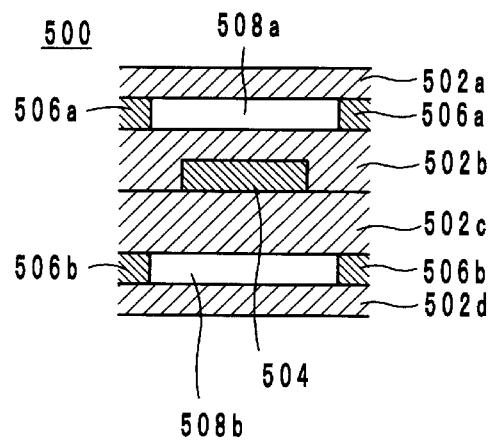

Hereinafter, a circuit substrate according to a second preferred embodiment of the present invention will be described with reference to drawings. FIG. 4 is an exploded perspective view of a circuit substrate 110 according to the second preferred embodiment. In FIG. 4, the lamination direction of the circuit substrate 110 is defined as a z axis direction. In addition, the longitudinal direction of the circuit substrate 110 is defined as an x axis direction, and a direction perpendicular to the x axis direction and the z axis direction is defined as a y axis direction.

As illustrated in FIG. 4, the circuit substrate 110 preferably includes a laminated body 112, an external terminal 114, ground conductors 130 (130a, 130b), 134 (134a, 134b), and 140 (140a, 140b), a linear signal line 132 (132a to 132d), and a via hole conductor B. In addition, reference symbols are only assigned to the representative examples of the external terminal 114 and the via hole conductor B.

As illustrated in FIG. 4, the laminated body 112 includes a signal line portion 116 and circuit portions 118 and 120. The signal line portion 116 extends in the x axis direction, and includes the linear signal line 132 and the ground conductors 130 and 134. The signal line portion 116 is configured so as to be able to be bent into a U shape. The circuit portions 118 and 120 are provided at both ends of the signal line portion 116 in the x axis direction, and include circuits. In this regard, however, in FIG. 4, the illustration of the corresponding circuits is omitted. Insulation sheets (insulator layers) 122 (122a to 122d) illustrated in FIG. 4 are laminated from the positive direction side of the z axis direction to the negative direction side thereof in this order, thereby configuring the laminated body 112.

The insulation sheet 122 is configured using thermoplastic resin such as liquid crystalline polymer having flexibility, or the like. As illustrated in FIG. 4, the insulation sheets 122a to 122d are configured using signal line portions 124a to 124d, circuit portions 126a to 126d, and circuit portions 128a to 128d, respectively. The signal line portion 124 configures the signal line portion 116 of the laminated body 112, and the circuit portions 126 and 128 configure the connector portions 118 and 120 of the laminated body 112, respectively. In addition, hereinafter, a main surface on a positive direction side in the z axis direction of the insulation sheet 122 is referred to as a front surface, and a main surface on a negative direction side in the z axis direction of the insulation sheet 122 is referred to as a back surface.

As illustrated in FIG. 4, a plurality of the external terminals 114 are provided on the front surfaces of the circuit portions 126a and 128a. In the external terminal 114, a semiconductor integrated circuit, a chip-type electronic component, or the like is mounted.

As illustrated in FIG. 4, the signal lines 132a to 132d are linear conductors provided within the signal line portion 116, and are provided on the front surface of the insulation sheet 122c. The linear signal lines 132a to 132d extend in parallel or substantially in parallel to one another in the x axis direction on the front surface of the insulation sheet 124c. In addition, both ends of each of the linear signal lines 132a to 132d are located at the circuit portions 126c and 128c, respectively, and are connected to circuits (not illustrated) provided in the circuit portions 126c and 128c.

As illustrated in FIG. 4, the ground conductors 130a and 130b are provided on a positive direction side in the z axis direction within the signal line portion 116, compared with the linear signal lines 132a and 132b, and more specifically, are provided on the front surface of the insulation sheet 122b. The ground conductors 130a and 130b extend in the x axis direction on the front surface of the linear signal line portion 124b. Both ends of each of the ground conductors 130a and 130b are located at the circuit portions 126b and 128b, respectively, and are connected to circuits (not illustrated) provided in the circuit portions 126b and 128b. Furthermore, as illustrated in FIG. 4, the ground conductors 130*a* and 130*b* overlap with the linear signal lines 132*a* and 132*b*, respectively, in the planar view seen from the z axis direction.

In addition, as illustrated in FIG. 4, in the ground conductors 130*a* and 130*b*, a plurality of opening portions O in which no conductor is provided are arranged along the linear signal lines 132*a* and 132*b* in the planar view seen from the z axis direction. In addition, in FIG. 4, a reference symbol is only assigned to the representative example of the opening portions O. In addition, since the configurations of the opening portions O are preferably the same as those of the opening portions O1 to O8 in the signal line 10*a*, the further descriptions thereof will be omitted.

As illustrated in FIG. 4, the ground conductors 134*a* and 134*b* are provided on a negative direction side in the z axis direction within the signal line portion 116, compared with the linear signal lines 132*a* and 132*b*, and more specifically, are provided on the front surface of the insulation sheet 122*d*. The ground conductors 134*a* and 134*b* extend in the x axis direction on the front surface of the signal line portion 124*d*. Both ends of each of the ground conductors 134*a* and 134*b* are located in the circuit portions 126*d* and 128*d*, respectively, and connected to the ground conductors 140*a* and 140*b* provided in the circuit portions 126*d* and 128*d*, respectively. Furthermore, as illustrated in FIG. 4, the ground conductors 134*a* and 134*b* overlap with the linear signal lines 132*a* and 132*b*, respectively, in the planar view seen from the z axis direction. In addition, no opening O is provided in the ground conductors 134*a* and 134*b*.

The ground conductors 140*a* and 140*b* are arranged to cover approximately the entire surfaces of the circuit portions 126*d* and 128*d*, and a ground potential is applied to the ground conductors 140*a* and 140*b*. Since the ground conductors 140*a* and 140*b* are manufactured using metal foil or the like, it is hard for the ground conductors 140*a* and 140*b* to be deformed, compared with the insulation sheet 122. Here, in the planar view seen from the z axis direction, the percentage of the metal foil in the circuit portions 118 and 120 preferably is higher than the percentage of the metal foil in the signal line portion 116. Therefore, it is hard for the circuit portions 118 and 120 to be deformed, compared with the signal line portion 116. More specifically, in the circuit substrate 110, the circuit portions 118 and 120 configure a rigid portion, and the signal line portion 116 configures a flexible portion. In this way, the rigid portion is provided, and hence it is possible to stably and reliably mount an electronic component, a semiconductor integrated circuit, or the like on the circuit portions 118 and 120.

As illustrated in FIG. 4, the via hole conductors B are provided so as to penetrate through the signal line portion 124*b* in the z axis direction, and connect the ground conductors 130*a* and 130*b* to the ground conductors 134*a* and 134*b*, respectively. In addition, since the via hole conductors B are preferably the same as the via hole conductors B1 to B36 in the signal line 10*a*, the descriptions thereof will be omitted.

The insulation sheets 122*a* to 122*d* having the above-mentioned configurations are laminated, and hence the ground conductors 130*a* and 134*a* and the linear signal line 132*a* define a stripline structure. In the same way, the ground conductors 130*b* and 134*b* and the linear signal line 132*b* define a stripline structure. Furthermore, the ground conductors 130*a* and 130*b* are connected to the ground conductors 134*a* and 134*b* using the via hole conductors B.

The circuit substrate 110 having the above-mentioned configuration is used in a state in which the circuit substrate 110 is inflected. More specifically, in the planar view seen from the y axis direction, the signal line portion 116 is inflected so as to form a U shape protruding toward a positive direction side in the z axis direction.

In the same way as the signal line 10*a*, it is possible for the circuit substrate 110 as described above to be easily inflected and to significantly reduce unnecessary radiation.

In addition, the openings O may also be provided in the ground conductors 134*a* and 134*b*.

Preferred embodiments of the present invention are useful for a signal line and a circuit substrate, and, in particular, superior in that it is possible to inflect the signal line and the circuit substrate and it is possible to reduce unnecessary radiation.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A signal line comprising:
   a laminated body including a plurality of insulator layers that include flexible material and are laminated on each other in a lamination direction;
   a linear signal line provided within the laminated body;
   a first ground conductor located above the linear signal line in the lamination direction within the laminated body and overlapping with the linear signal line in a planar view seen from the lamination direction;
   a second ground conductor located below the linear signal line in the lamination direction within the laminated body and overlapping with the linear signal line in the planar view seen from the lamination direction; and
   a via hole conductor connecting the first ground conductor and the second ground conductor to each other; wherein
   in the first ground conductor, a plurality of first opening portions are arranged along the linear signal line in the planar view seen from the lamination direction; and
   in the planar view seen from the lamination direction, the via hole conductor is provided on an imaginary line that connects two corners of the first opening portions adjacent to one another.

2. The signal line described in claim 1, wherein in the second ground conductor, a plurality of second opening portions are arranged to overlap with the first opening portions such that the second opening portions coincide with the first opening portions, in the planar view seen from the lamination direction.

3. The signal line described in claim 1, wherein an opening portion in which no conductor layer is provided is not provided in the second ground conductor, and the laminated body is inflected so that the first ground conductor is located on an outer periphery side thereof, compared with a location of the second ground conductor.

4. The signal line described in claim 1, wherein the via hole conductor is provided on a perpendicular bisector with respect to centers of the first openings that are adjacent to each other, in the planar view seen from the lamination direction.

5. The signal line described in claim 1, wherein the first openings overlap with the linear signal line in the planar view seen from the lamination direction.

6. A circuit substrate comprising:
   a main body including a plurality of insulator layers that include flexible material and are laminated on each other in a lamination direction and including a first circuit portion, a second circuit portion, and a signal line portion;

a linear signal line provided within the signal line portion;

a first ground conductor located above the linear signal line in the lamination direction within the signal line portion and overlapping with the linear signal line in a planar view seen from the lamination direction;

a second ground conductor located below the linear signal line in the lamination direction within the signal line portion and overlapping with the linear signal line in the planar view seen from the lamination direction; and a via hole conductor connecting the first ground conductor and the second ground conductor to each other; wherein in the first ground conductor, a plurality of first opening portions are arranged along the linear signal line in the planar view seen from the lamination direction;

in the planar seen view from the lamination direction, the via hole conductor is provided on an imaginary line that connects two corners of the first opening portions adjacent to one another; and the first circuit portion and the second circuit portion include a first circuit and a second circuit, respectively, the first circuit and the second circuit being connected to the linear signal line, the first ground conductor, and the second ground conductor.

7. The circuit substrate described in claim 6, wherein in the second ground conductor, a plurality of second opening portions are arranged to overlap with the first opening portions such that the second opening portions coincide with the first opening portions, in the planar view seen from the lamination direction.

8. The circuit substrate described in claim 6, wherein an opening portion in which no conductor layer is provided is not provided in the second ground conductor, and the laminated body is inflected so that the first ground conductor is located on an outer periphery side thereof, compared with a location of the second ground conductor.

9. The circuit substrate described in claim 6, wherein the via hole conductor is provided on a perpendicular bisector with respect to centers of the first openings that are adjacent to each other, in the planar view seen from the lamination direction.

10. The circuit substrate described in claim 6, wherein the first openings overlap with the linear signal line in the planar view seen from the lamination direction.

* * * * *